United States Patent
Lane et al.

(10) Patent No.: US 7,245,244 B1
(45) Date of Patent: Jul. 17, 2007

(54) CORRECTION METHODS AND STRUCTURES FOR ANALOG-TO-DIGITAL CONVERTER TRANSFER FUNCTIONS

(75) Inventors: Charles Dwight Lane, Greensboro, NC (US); Ziwei Zheng, Jamestown, NC (US); John Jerome Kornblum, Greensboro, NC (US); Baeton Charles Rigsbee, High Point, NC (US)

(73) Assignee: Analog Devices, Inc., Norwood, MA (US)

( * ) Notice: Subject to any disclaimer, the term of this patent is extended or adjusted under 35 U.S.C. 154(b) by 480 days.

(21) Appl. No.: 10/911,314

(22) Filed: Aug. 3, 2004

(51) Int. Cl.
*H03M 1/06* (2006.01)

(52) U.S. Cl. ...................... 341/118; 714/740
(58) Field of Classification Search ............... 714/740; 341/118
See application file for complete search history.

(56) References Cited

U.S. PATENT DOCUMENTS

| | | | |
|---|---|---|---|
| 4,764,748 A | 8/1988 | Geen et al. ................. | 340/347 |
| 5,990,814 A | 11/1999 | Crowman et al. .......... | 341/118 |
| 6,084,538 A | 7/2000 | Kostelnik et al. ........... | 341/120 |
| 6,198,416 B1 | 3/2001 | Velazquez ................... | 341/118 |
| 6,232,898 B1 | 5/2001 | Nagaraj ....................... | 341/120 |
| 6,388,594 B1 | 5/2002 | Velazquez ................... | 341/120 |
| 6,424,275 B1 | 7/2002 | Velazquez ................... | 341/118 |
| 6,642,871 B2 | 11/2003 | Takeyabu et al. ........... | 341/120 |
| 6,891,491 B2* | 5/2005 | Nakamura et al. .......... | 341/118 |
| 2004/0100397 A1* | 5/2004 | Ahmed Mohamed ....... | 341/118 |

FOREIGN PATENT DOCUMENTS

EP 240055 A1 * 10/1987

OTHER PUBLICATIONS

D Moulin et al.; On Aid Converter Linearization Using Two-Dimensional Error-Correction Tables; Analogue to Digital and Digital to Analogue Conversion, 1991., International Conference on; Publication date: Sep. 17-19, 1991; pp. 1-6.*

* cited by examiner

*Primary Examiner*—R. Stephen Dildine
(74) *Attorney, Agent, or Firm*—Koppel, Patrick, Heybl & Dawson

(57) ABSTRACT

Methods and structures are provided to improve the transfer functions of analog-to-digital converter systems. They address the converter error function that corresponds to a converter's transfer function. In particular, they provide a corrector with a corrector transfer function that defines a corrector error function which substantially mirrors at least a portion of the converter error function. The corrector processes the converter's output digital signals to realize corrector digital signals which are then combined with the original output digital signals to obtain a system with a system error function that is significantly reduced from the original converter error function.

25 Claims, 6 Drawing Sheets

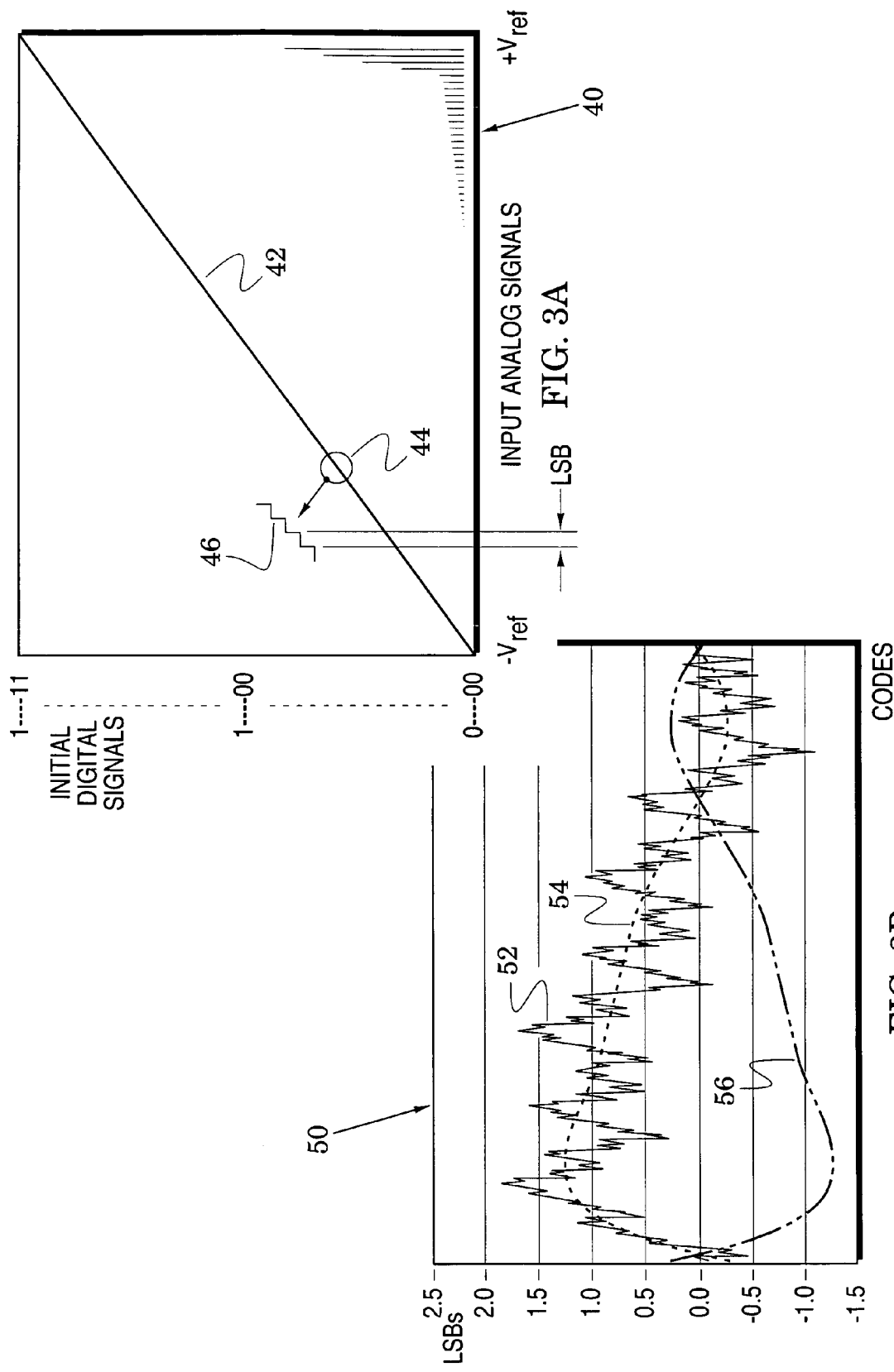

CORRECTION METHODS AND STRUCTURES FOR ANALOG-TO-DIGITAL CONVERTER TRANSFER FUNCTIONS

BACKGROUND OF THE INVENTION

1. Field of the Invention

The present invention relates generally to analog-to-digital converters.

2. Description of the Related Art

To meet the requirements of modern signal processing systems, there is a continuing effort to increase the accuracy of the transfer functions of analog-to-digital converters. This accuracy is often measured by considering a converter error function that corresponds to the transfer function. A converter error function in the form of an integral nonlinearity function 17 is shown in the graph 16 of FIG. 1A. It is noted that the function ranges over a total excursion of approximately 2 least significant bits (LSBs).

It is further noted that there is a repeating pattern in the converter error function. In an exemplary subranging analog-to-digital converter, each repeating pattern may correspond to a subranging point of the first converter stage of the converter. One conventional linearization process thus provides converter calibration at these key subranging points to achieve the converter error function 19 shown in the graph 18 of FIG. 1B. However, calibration processes are generally limited in their improvement of the converter error function. For example, it is noted that the calibrated converter error function 19 still ranges over a total excursion on the order of 1.4 LSBs.

BRIEF SUMMARY OF THE INVENTION

The present invention is directed to methods and structures that significantly improve the transfer functions of analog-to-digital converters.

The novel features of the invention are set forth with particularity in the appended claims. The invention will be best understood from the following description when read in conjunction with the accompanying drawings.

BRIEF DESCRIPTION OF THE DRAWINGS

FIG. 3A is a graph of a converter transfer function for an analog-to-digital converter in the system of FIG. 2;

FIG. 3B is a graph of a converter error function that corresponds to the converter transfer function of FIG. 3A and of a mirrored corrector error function for a corrector in the system of FIG. 2;

DETAILED DESCRIPTION OF THE INVENTION

Figure 1A:
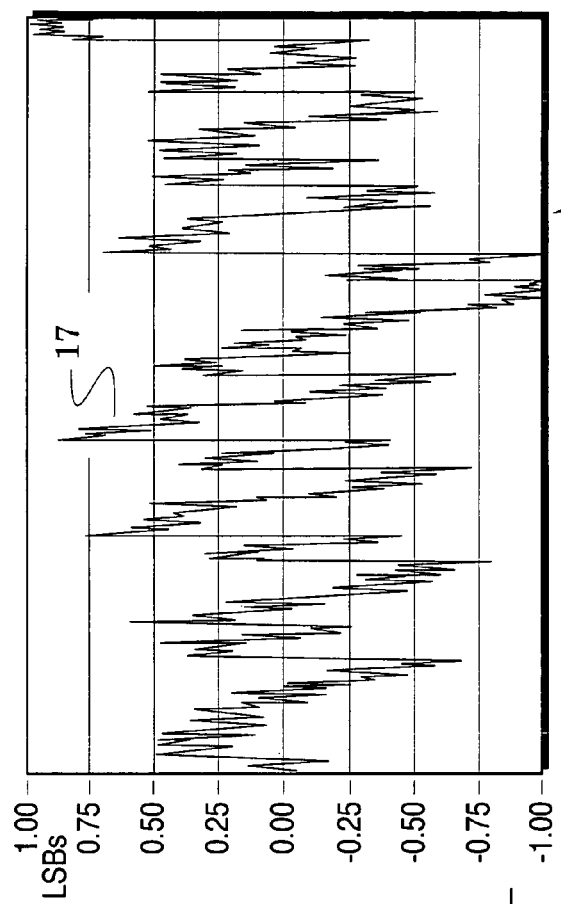
FIGS. 1A and 1B are graphs of converter error functions before and after calibration of a conventional analog-to-digital converter.
Figure 1B:
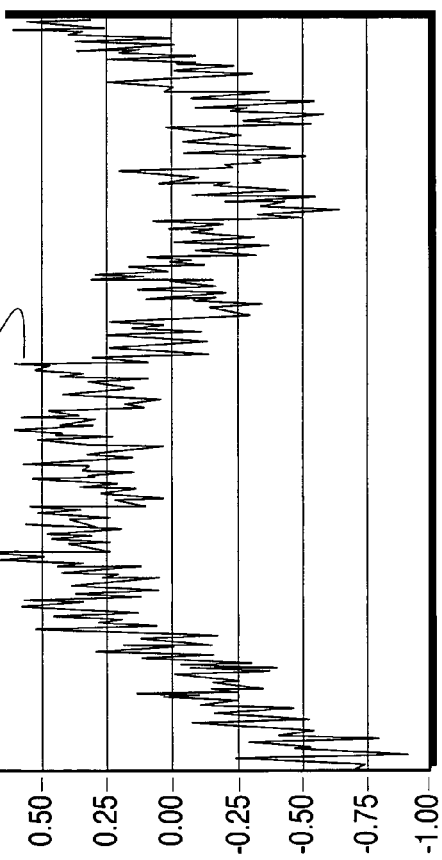
Figure 2:
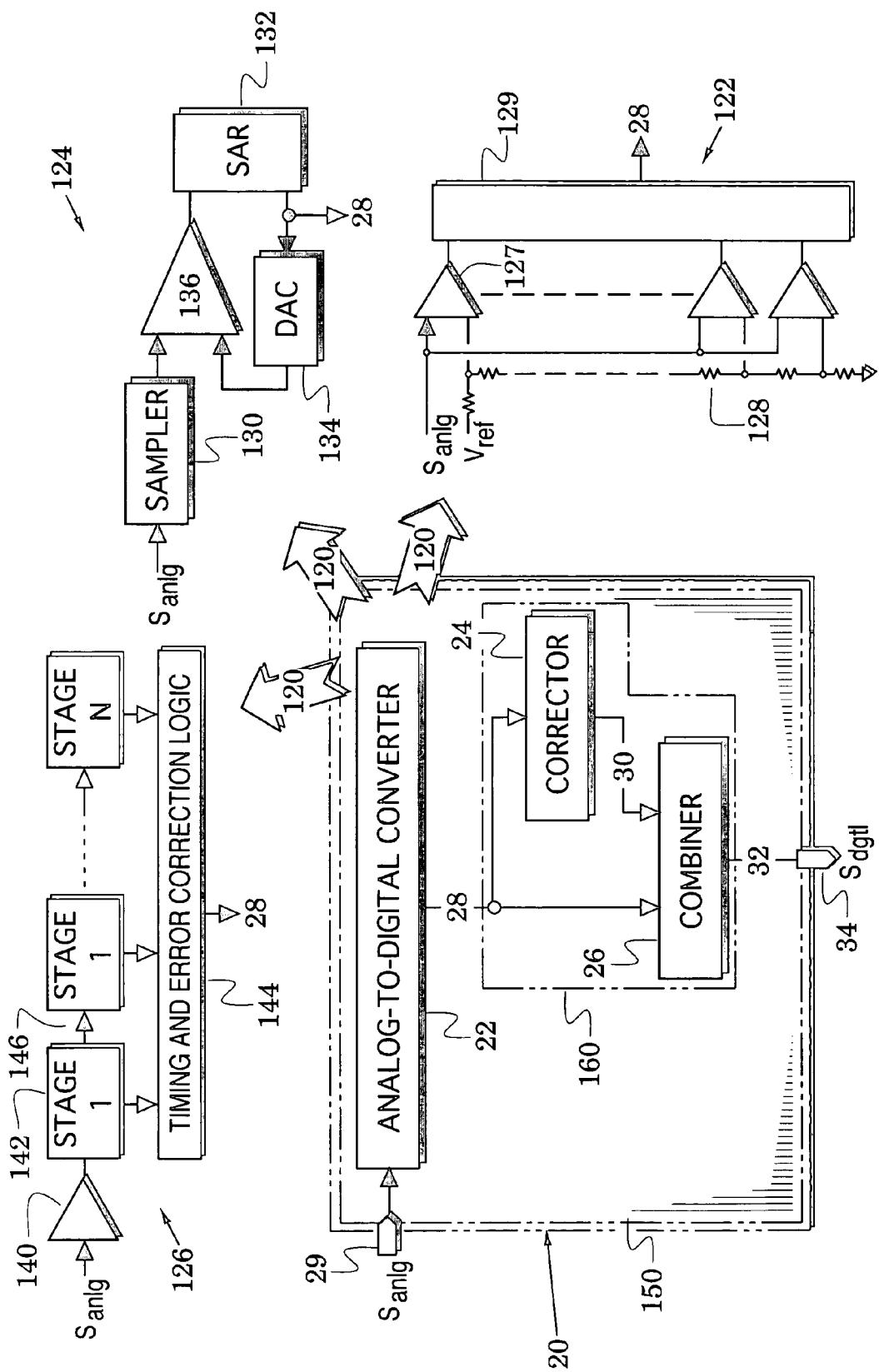
FIG. 2 is a block diagram of an analog-to-digital converter system embodiment of the present invention.

FIGS. 2-5 illustrate converter systems that significantly reduce converter error functions by generating corrector error functions that mirror at least a portion of the original converter error function. In particular, a converter system embodiment 20 of the present invention is shown in FIG. 2. The system includes an analog-to-digital converter (ADC) 22, a corrector 24 and a combiner 26. The converter 22 provides initial digital signals 28 in response to input analog signals $S_{anlg}$ at a system input port 29. In particular, the converter converts the input analog signals to corresponding initial digital signals in accordance with a converter transfer function that defines a converter error function.

The corrector 24 is configured to transform the initial digital signals 28 to corresponding corrector digital signals 30 with a corrector transfer function that defines a corrector error function which substantially mirrors at least a portion of the converter error function. Finally, the combiner 26 combines the initial digital signals 28 and the corrector digital signals 30 to form corresponding output digital signals 32 at a system output port 34.

Operation of the converter system 20 may be illustrated with reference to the graph 40 of FIG. 3A which shows the converter transfer function 42 of the ADC 22. The converter transfer function maps the initial digital signals (28 in FIG. 2) that are produced in response to the input analog signals ($S_{anlg}$ in FIG. 2). The graph portion of the transfer function within the circle 44 is significantly magnified to show that the function defines a staircase shape 46. From the magnified shape 46, it is apparent that the converter (22 in FIG. 2) has quantized the input analog signal to a resolution of a significant bit (LSB).

The graph 50 of FIG. 3B illustrates a converter error function 52 that corresponds to the converter transfer function 42 of FIG. 3A. Although various functions can be used to show errors, FIG. 3B shows an integral nonlinearity (INL) function which is a cumulative measure (typically expressed in LSBs) of linearity errors in the converter transfer function. As such, it indicates maximum deviation at all points along the transfer function of the converter (20 in FIG. 2) from an ideal linear function. Accordingly, it indicates deviation of the digital code (initial digital signal 28 of FIG. 2) from that of an ideal converter.

An average shape of the converter error function 52 is given by the polynomial function 54 of FIG. 3B which is a linear combination of powers of an independent variable (the horizontal axis of the graph 50) that are multiplied by respective coefficients that provide the best match to the general shape of the converter error function. Although various conventional methods may used to determine the best match, one using a least squares method (i.e., one that obtains the minimal sum of squared deviations) provides an exemplary function of $$y = -3.16207e^{-20}x^6 + 4.77962e^{-16}x^5 - 2.75491e^{-12}x^4 + 7.68588e^{-9}x^3 - 1.08786e^{-5}x^2 + 6.93946e^{-3}x - 3.41019e^{-1}$$

which is shown as the plot 54 in FIG. 3B.

The present invention recognizes that a mirror function of this polynomial function (i.e., the polynomial function mirrored about the 0.0 LSB axis of FIG. 3B) can be combined with it to produce an error function that represents significantly reduced errors. Accordingly, FIG. 3B illustrates a corrector error function 56 which is the mirror of the polynomial function 54 and thus a substantial mirror of the converter error function 52.

Figure 3C:
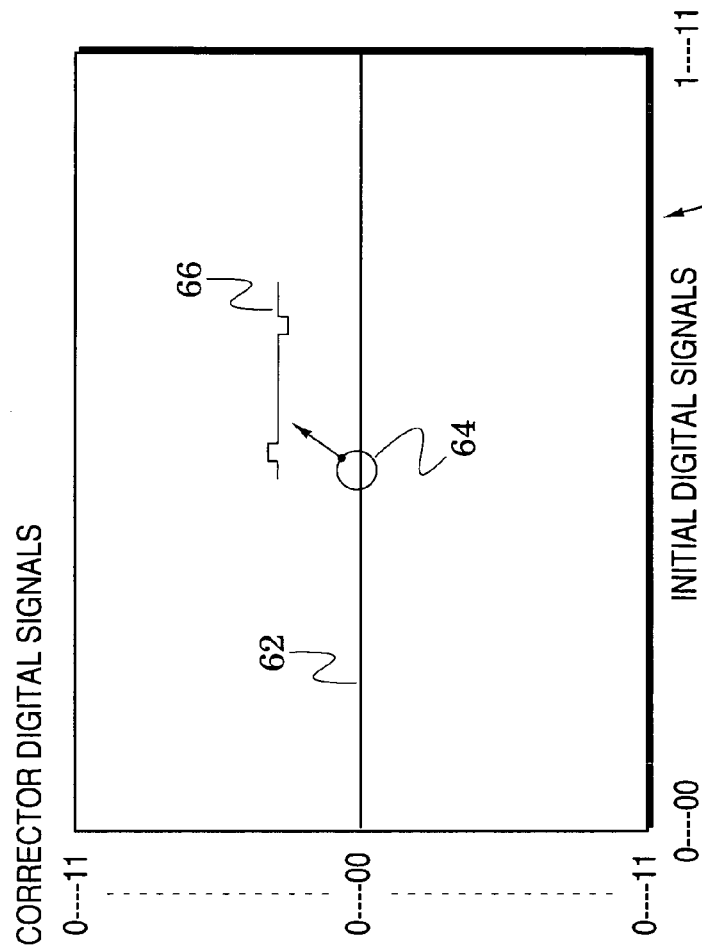
FIG. 3C is a graph of a corrector transfer function for the corrector in the system of FIG. 2.
Figure 3D:
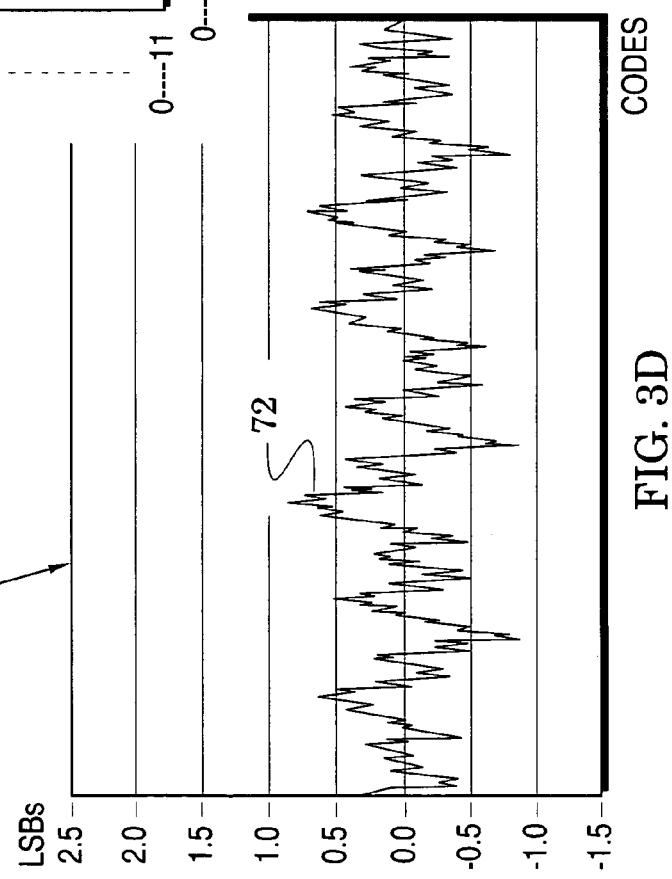
FIG. 3D is a graph of a system error function that corresponds to the system of FIG. 2.

The graph 60 of FIG. 3C illustrates a corrector transfer function 62 that corresponds to the corrector error function 56 of FIG. 3B. The corrector transfer function within the circle 64 is significantly magnified to show that the function defines deviations 66 whose cumulative deviation is represented by the corrector error function 56.

Returning attention to FIG. 2, it is noted that the corrector 24 transforms the initial digital signals 28 with its corrector transfer function (62 in FIG. 3C) to provide the corrector digital signals 30. The combiner 32 then combines the initial digital signals 28 from the ADC 22 and the corrector digital signals 30 from the corrector 24 to thereby provide the system's output digital signals 32 at the system output port 34. Because of the canceling action between the converter error function (52 in FIG. 3B) and the corrector error function (56 in FIG. 3B), the system 20 obtains the system error function 72 that is shown in the graph 70 of FIG. 3D. A comparison of the system error function 72 to the converter error function (52 in FIG. 3B) reveals that the conversion errors of the system 20 of FIG. 2 have been significantly reduced from the conversion errors of the ADC 22.

Figure 4:
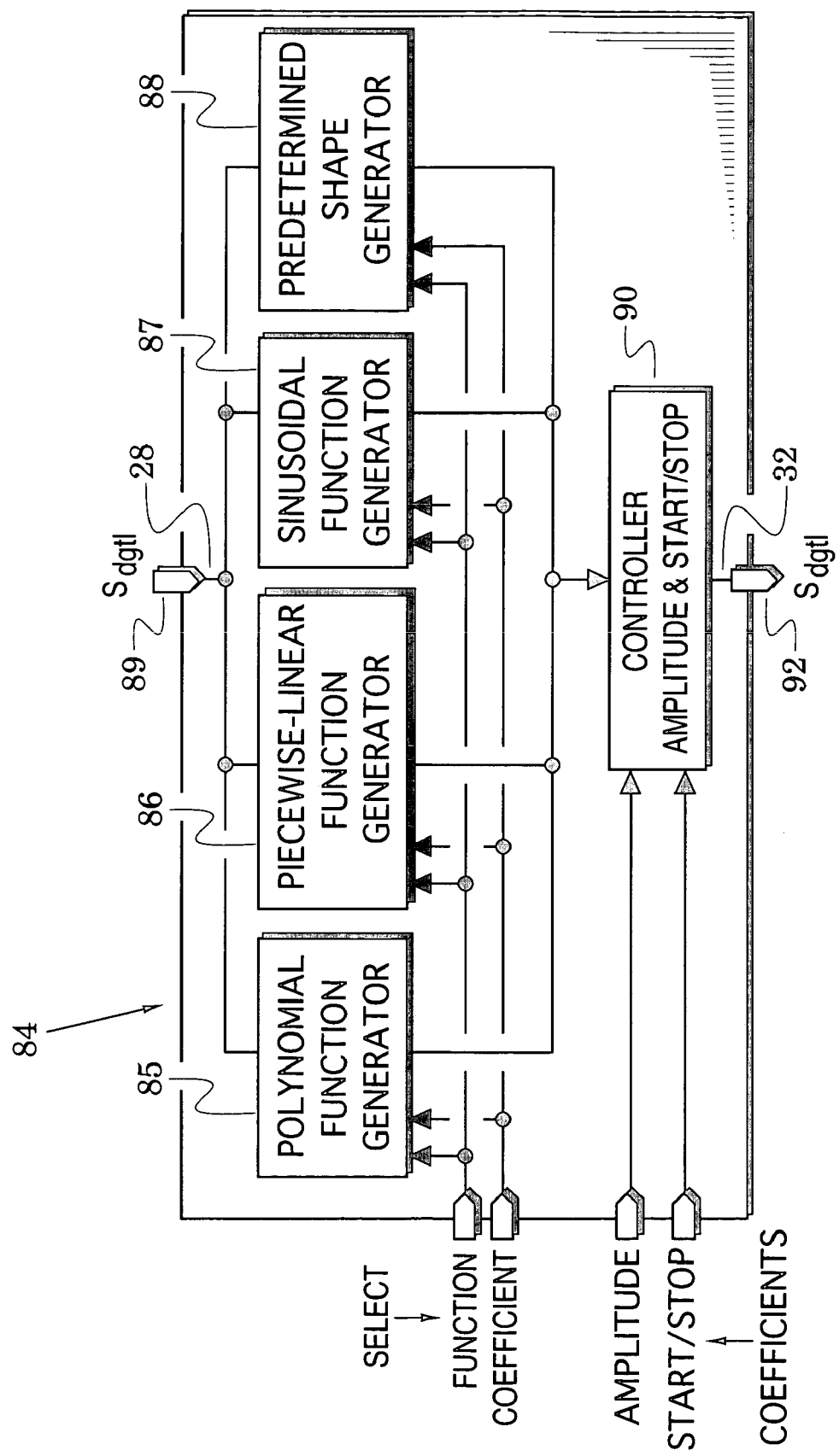
FIG. 4 is a block diagram of a corrector embodiment in the system of FIG. 2.

The corrector error function 56 of FIG. 3B has the exemplary form of a polynomial function. In contrast, FIG. 4 illustrates an embodiment 84 of the corrector (24 in FIG. 2) which can provide various corrector error functions. In particular, the corrector 84 includes a polynomial function generator 85, a piecewise-linear function generator 86, a sinusoidal function generator 87 and a predetermined shape generator 88. Each of these generators can receive the initial digital signals (28 in FIG. 2) from a corrector port 89. In response, they provide functions of these signals to a controller 90 which can adjust their amplitudes and, if desired, select portions of them by selective start and stop processes. The final corrector digital signals (32 in FIG. 2) are provided at a corrector output port 92.

The polynomial function generator forms functions such as the polynomial function 54 of FIG. 3B. In contrast, the piecewise-linear function generator 86 would form a similar function that comprises only straight segments. The sinusoidal function generator 87 essentially replaces the powers of an independent variable in the previously-described polynomial expression with sinusoids of multiples of the independent variable (e.g., sin x, sin 2x and so on). The predetermined shape generator 88 provides functions having any shape that has been determined to substantially mirror the converter error function (42 in FIG. 3A).

Figure 5:
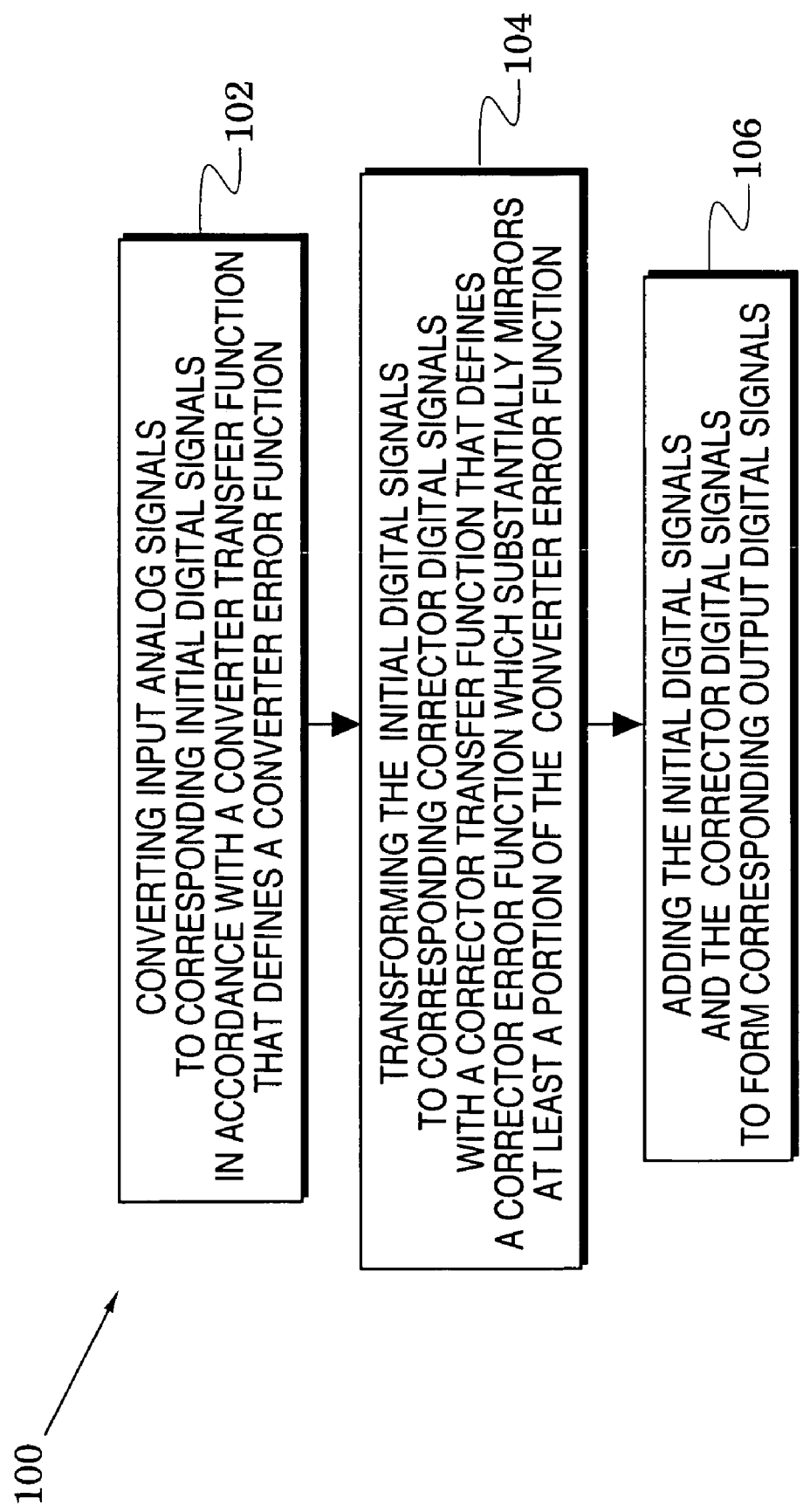
FIG. 5 is a flow chart that recites operational processes in the system of FIG. 2.

Basic operational processes of the system 20 of FIG. 2 are shown in the flow chart 100 of FIG. 5. In a first process 102, input analog signals ($S_{anlg}$ in FIG. 2) are converted to corresponding initial digital signals (28 in FIG. 2) in accordance with a converter transfer function (42 in FIG. 3A) that defines a converter error function (52 in FIG. 3B). The initial digital signals are transformed in process 104 to corresponding corrector digital signals (30 in FIG. 2) with a corrector transfer function (62 in FIG. 3C) that defines a corrector error function (56 in FIG. 3B) which substantially mirrors at least a portion of the converter error function. Finally, the initial digital signals and the corrector digital signals are combined to form corresponding output digital signals (32 in FIG. 2).

The features of the invention can be applied to a variety of ADCs. For example, arrows 120 in FIG. 2 indicate that the ADC 22 can be realized as various ADCs such as a flash ADC 122, a successive-approximation ADC 124 or a pipelined (subranging) ADC 126. The flash converter includes comparators 127 that compare the input analog signal $S_{anlg}$ to different references that are provided by a resistive divider network 128. The outputs of the comparators are converted to the initial digital code 32 by a decoder 129.

The successive-approximation ADC 124 includes a sampler 130, a successive-approximation register (SAR) 132, a digital-to-analog converter 134 and a comparator 136. The register provides digital bits which are converted to analog signals by the DAC and compared to samples of the input analog signal $S_{anlg}$ that are provided by the sampler 130. The output of the comparator determines if a significant bit of the register is correct or should be altered. This process then proceeds to examine and, if necessary, correct lesser bits.

The pipelined ADC 126 includes a sampler 140, converter stages 142 and a correction logic 144. A first converter stage converts samples of the input analog signal $S_{anlg}$ from the sampler 140 to digital signals that are provided to the logic 144 and to a residue signal 146 that is provided to a second converter stage. The residue is successively converted in a similar manner after which the logic 144 provides the output digital signal 32.

The transfer nonlinearities of ADCs cause them to generate harmonics of the fundamental output signal at their output port and the amplitude of these harmonics provides a measure of their performance. For example, 10 conventional pipeline ADCs were tested and found to generate second harmonics that were in the range of 74 dB to 82 dB below the fundamental. Simulations of the corrector teachings of the invention showed that the second harmonics of nine of these ADCs would be reduced to the range of 90 dB to 104 dB below the fundamental and the second harmonic of the tenth ADCs could be reduced to 84 dB. The third harmonics were initially in the range of 70 dB to 84 dB below the fundamental and simulations showed a reduction to the range of 92 dB to 102 dB for 6 of these units with lesser reductions for the remaining 4 units.

Simulations have also showed that the corrector teachings of the invention may be optimized for various operating conditions, e.g., different temperatures, different supply voltages, different signal frequencies and different sample rates. Accordingly, correctors such as the corrector 84 of FIG. 4 may be configured with different parameters (e.g., functions, function coefficients, function amplitudes and start/stop conditions) that corresponded to different sets of the operating conditions. For example, the polynomial function generator 85 of FIG. 4 might be configured with one set of coefficients for one operating temperature range and another set for a different range to thereby enhance reduction of the system error function.

Although the corrector error function 56 of FIG. 3B could have been configured to exactly mirror the converter error function 52, this would require extensive circuitry (e.g., memory) in the corrector 24 of FIG. 2. Substantial reductions of the system error function (e.g., 72 in FIG. 3D) can be realized with corrector error functions that substantially mirror at least a portion of the converter error function or that substantially mirror all or at least a portion of an average shape of the converter error function.

Converter systems can be configured to receive different input parameters that enhance their performance under different operating conditions. Other converter systems may be provided with sensors (e.g., temperature sensors, rate sensors) that adjust the parameters accordingly. Some converters may need linearization only over a particular portion of the converter range. Other converters may benefit from a repetitive linearization pattern. The start/stop inputs to the controller 90 of FIG. 4 are especially suited for this type of operation.

The correctors of the invention, e.g., the corrector 84 of FIG. 4 may be realized with a variety of circuits which include recallable memories, arrays of logic gates, appropriately-programmed digital processors and combinations thereof. As indicated by the package outline 150 in FIG. 2, converter systems of the invention are especially suited to be carried in or on various integrated circuit packages such as small outline packages (SOIC), in-line packages (IP), stacked multichip packages (MCP), face down fine-pitch ball grid arrays (FD-FBGA), flip chip-ball grid arrays (FC-BGA) and multi frame-lead over chips (MF-LOC).

These converter systems are thus stand-alone, self-contained signal processing elements which can operate without the need for add-on circuitry (e.g., external digital processing). Because each system has a dedicated corrector structure, that structure (e.g., its function generator) can be configured to specifically match the errors of the system's ADC (i.e., it is not limited by the need to address the errors of a wide range of ADCs). The internal signal processing of many ADCs (e.g., pipelined ADCs) operate at a finer resolution than their output resolution. Because the systems of the invention have self-contained corrector structures, these structures can be configured to use their additional internal resolution to further reduce the system error function.

The combining processes of the combiner 26 of FIG. 2 may be intimately associated with the transforming processes of the corrector 24 so that they may be replaced in other system embodiments with a corrector system (160 in FIG. 2) that simply processes the initial digital signals 28 to corresponding output digital signals 32 with a corrector transfer function that defines a corrector error function which substantially mirrors at least a portion of the converter error function (of the converter 22).

Although converter systems of the invention can achieve reduced system error functions, they do not prohibit use of conventional calibration techniques that address typical converter errors (e.g., capacitor mismatch, limited amplifier gain, and offset errors). These calibration techniques may reduce the effects of pre-determined error sources but generally leave a degree of residual converter error. This may be because it is impractical to completely carry them out (e.g., excessive number of converter stages in pipelined ADCs) or because they are difficult to implement without compromising the basic converter processes. These calibration techniques may be applied, for example, to the ADC 22 of FIG. 2 prior to its integration with the corrector 24 and combiner 26.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of converting input analog signals to output digital signals, comprising the steps of:
   converting input analog signals to corresponding initial digital signals in accordance with a converter transfer function that defines a converter error function;
   transforming said initial digital signals to corresponding corrector digital signals with a corrector transfer function that defines a corrector error function which substantially mirrors at least a portion of said converter error function; and
   combining said initial digital signals and said corrector digital signals to form corresponding output digital signals.

2. The method of claim 1, wherein said converter error function and said corrector error function are integral non-linearity functions.

3. A method of converting input analog signals to output digital signals, comprising the steps of:
   converting input analog signals to corresponding initial digital signals in accordance with a converter transfer function that defines a converter error function;
   transforming said initial digital signals to corresponding corrector digital signals with a corrector transfer function that defines a corrector error function which substantially mirrors at least a portion of said converter error function; and
   combining said initial digital signals and said corrector digital signals to form corresponding output digital signals;
   wherein said transforming step includes the step of configuring said corrector error function to substantially mirror an average shape of said converter error function.

4. The method of claim 3, wherein said transforming step includes the step of configuring said corrector error function to exactly mirror said converter error function.

5. The method of claim 3, wherein said converting step includes the steps of:
   converting said input analog signals to initial bits of said initial digital signals and a residue signal; and
   successively converting said residue signal to remaining bits of said initial digital signals.

6. The method of claim 3, wherein said transforming step includes the step of configuring said corrector error function as at least one of a polynomial function, a piecewise-linear function and a sinusoidal function.

7. The method of claim 3, wherein said converting step includes the step of successively approximating said input analog signals.

8. The method of claim 3, wherein said converting step includes the step of comparing said input analog signals to a plurality of reference signals.

9. A method of converting input analog signals to output digital signals, comprising the steps of:
   converting input analog signals to corresponding initial digital signals in accordance with a converter transfer function that defines a converter error function;
   transforming said initial digital signals to corresponding corrector digital signals with a corrector transfer function that defines a corrector error function which substantially mirrors at least a portion of said converter error function; and
   combining said initial digital signals and said corrector digital signals to form corresponding output digital signals;
   wherein said combining step includes the step of adding said initial digital signals and said corrector digital signals.

10. An analog-to-digital converter system, comprising:
    an analog-to-digital converter that converts input analog signals to corresponding initial digital signals in accordance with a converter transfer function that defines a converter error function; and
    a corrector system that processes said initial digital signals to corresponding output digital signals with a corrector transfer function that defines a corrector error function which substantially mirrors at least a portion of said converter error function.

11. The system of claim 10, wherein said converter error function and said corrector error function are integral non-linearity functions.

12. An analog-to-digital converter system, comprising:
an analog-to-digital converter that converts input analog signals to corresponding initial digital signals in accordance with a converter transfer function that defines a converter error function; and
a corrector system that processes said initial digital signals to corresponding output digital signals with a corrector transfer function that defines a corrector error function which substantially mirrors at least a portion of said converter error function;
wherein said corrector error function substantially mirrors an average shape of said converter error function.

13. The system of claim 12, wherein said corrector error function exactly mirrors said converter error function.

14. The system of claim 12, further including a circuit package that carries said converter and said corrector system.

15. An analog-to-digital converter system, comprising:
an analog-to-digital converter that converts input analog signals to corresponding initial digital signals in accordance with a converter transfer function that defines a converter error function;
a corrector that transforms said initial digital signals to corresponding corrector digital signals with a corrector transfer function that defines a corrector error function which substantially mirrors at least a portion of said converter error function; and
a combiner that combines said initial digital signals and said corrector digital signals to form corresponding output digital signals.

16. The system of claim 15, wherein said converter error function and said corrector error function are integral non-linearity functions.

17. The system of claim 15, wherein said combiner is configured to add said initial digital signals and said corrector digital signals.

18. The system of claim 15, wherein said corrector error function exactly mirrors said converter error function.

19. An analog-to-digital converter system, comprising:
an analog-to-digital converter that converts input analog signals to corresponding initial digital signals in accordance with a converter transfer function that defines a converter error function;
a corrector that transforms said initial digital signals to corresponding corrector digital signals with a corrector transfer function that defines a corrector error function which substantially mirrors at least a portion of said converter error function; and
a combiner that combines said initial digital signals and said corrector digital signals to form corresponding output digital signals;
wherein said corrector error function substantially mirrors an average shape of said converter error function.

20. The system of claim 19, wherein said corrector error function is as at least one of a polynomial function, a piecewise-linear function and a sinusoidal function.

21. The system of claim 19, wherein said corrector includes at least one of a memory, an array of logic gates and a digital processor that is configured to realize said corrector digital signals in response to said initial digital signals.

22. The system of claim 19, wherein said converter is a successive-approximation converter.

23. The system of claim 19, wherein said converter is a flash converter.

24. The system of claim 19, wherein said combiner is an adder.

25. The system of claim 19, further including a circuit package that carries said converter, corrector and combiner.

* * * * *